(12) United States Patent
Phelan et al.

(10) Patent No.: US 7,048,602 B2
(45) Date of Patent: May 23, 2006

(54) CORRECTING POTENTIAL DEFECTS IN AN OLED DEVICE

(75) Inventors: Giana M. Phelan, Rochester, NY (US); Michael L. Boroson, Rochester, NY (US); Lee W. Tutt, Webster, NY (US)

(73) Assignee: Eastman Kodak Company, Rochester, NY (US)

( * ) Notice: Subject to any disclaimer, the term of this patent is extended or adjusted under 35 U.S.C. 154(b) by 246 days.

(21) Appl. No.: 10/647,499

(22) Filed: Aug. 25, 2003

(65) Prior Publication Data

US 2005/0048862 A1    Mar. 3, 2005

(51) Int. Cl.
*H05B 33/10* (2006.01)
*G01B 11/28* (2006.01)

(52) U.S. Cl. ............... 445/3; 445/2; 445/24; 438/14; 356/630; 356/237.1

(58) Field of Classification Search .......... 445/2, 445/3, 5, 6, 24
See application file for complete search history.

(56) References Cited

U.S. PATENT DOCUMENTS

| 5,937,272 | A   | * | 8/1999  | Tang .................. 438/30 |
| 6,485,884 | B1  |   | 11/2002 | Wolk et al. |
| 2004/0009303 | A1 | * | 1/2004 | Ito et al. ............ 427/421 |
| 2004/0036856 | A1 | * | 2/2004 | Wittman et al. ........ 356/73 |

* cited by examiner

*Primary Examiner*—Karabi Guharay
*Assistant Examiner*—German Colón
(74) *Attorney, Agent, or Firm*—Raymond L. Owens (57) ABSTRACT

A method of making an OLED device that corrects for potential defect(s) identified in one processing station by adjusting a subsequent processing station includes processing an OLED substrate by adding at least one organic layer and measuring in-situ one or more parameters associated with such organic layer to produce a signal representative of potential defect(s) in a produced OLED device, and adjusting in a subsequent processing station in response to the signal to change the formation of a subsequent organic layer added to the OLED device to compensate for the potential defect(s).

12 Claims, 5 Drawing Sheets

CORRECTING POTENTIAL DEFECTS IN AN OLED DEVICE

CROSS REFERENCE TO RELATED APPLICATIONS

Reference is made to commonly assigned U.S. patent application Ser. No. 10/141,587 filed May 8, 2002 by Michael L. Boroson et al., entitled "In-Situ Method for Making OLED Devices That Are Moisture or Oxygen-Sensitive", and commonly assigned U.S. patent application Ser. No. 10/021,410 filed Dec. 12, 2001 by Bradley A. Phillips et al., entitled "Apparatus for Permitting Transfer of Organic Material From a Donor to Form a Layer in an OLED Device", the disclosures of which are herein incorporated by reference.

FIELD OF THE INVENTION

The present invention relates to making OLED devices which includes using radiation thermal transfer, and for identifying potential defects and correcting for such defects.

BACKGROUND OF THE INVENTION

Organic light-emitting diodes (OLEDs, also known as organic light-emitting devices) are generally anticipated to overtake liquid crystal displays (LCDs) as the preferred display technology. This is expected because OLEDs enjoy a number of practical advantages over LCDs. Some of the most significant advantages include: 1) OLEDs have a brighter image that can be viewed from wider angles; 2) elimination of backlight required in LCDs lowers cost, increases reliability, and improves image intensity range, contrast, and consistency over the viewing area; 3) OLEDs require less power for equivalent image quality; 4) OLEDs are potentially cheaper to manufacture, requiring fewer materials and roughly half the number of manufacturing steps; and 5) OLEDs produce a wider spectrum of colors. However, OLED displays and their components known as OLED structures, which constitute subpixels of the display, are more currently difficult and costly to manufacture than LCD displays. It is a continuing focus of the industry to increase throughput in an effort to lower the cost of OLED manufacturing.

Conventional OLED display devices are built on glass substrates such that a two-dimensional OLED array for image manifestation is formed. The basic OLED cell structure includes of a stack of thin organic layers sandwiched between an array of anodes and a common metallic cathode. The organic layers commonly comprise a hole-transporting layer (HTL), a light-emitting layer (LEL), and an electron-transporting layer (ETL). When an appropriate voltage is applied to the cell, the injected holes and electrons recombine in the LEL near the LEL-HTL interface to produce light (electroluminescence).

The LEL within a color OLED display device most commonly includes three different types of fluorescent or phosphorescent molecules that are repeated through the LEL. Red, green, and blue regions, or subpixels, are formed throughout the LEL during the manufacturing process to provide a two-dimensional array of pixels. Each of the red, green, and blue subpixel sets undergoes a separate patterned deposition, typically by evaporating a linear source through a shadow mask. Shadow masking is a well known technology, yet it is limited in both the precision of its deposition pattern, and the pattern's fill factor or aperture ratio; thus, incorporating shadow masking into OLED manufacturing limits the achievable sharpness and resolution of the resultant display. Radiation thermal transfer (RTT) promises significant advantages including a more precise deposition pattern and higher aperture ratio; however, it has proved challenging to adapt RTT to a high-throughput manufacturing line.

During RTT, a donor sheet having the desired organic material is placed into close proximity to the OLED substrate in a vacuum chamber. A source of radiation, such as a laser, impinges upon the donor sheet through a clear support to the donor sheet and is absorbed within a light-absorbing layer contained atop the support. The conversion of the radiation energy to heat sublimates the organic material that forms the top layer of the donor sheet and thereby transfers the organic material in a sharply defined subpixel pattern to the OLED substrate.

The quality of the RTT process is dependent on several key process and product parameters. Real-time knowledge of how these process and product parameters vary during manufacturing is an important aspect in making the RTT process repeatable and cost effective. What is needed is a way to measure key process and product parameters in-situ.

U.S. Pat. No. 6,485,884 provides a method for patterning oriented materials to make OLED display devices, and also provides donor sheets for use with the method, as well as methods for making the donor sheets. However, U.S. Pat. No. 6,485,884 patent fails to provide a system that enables in-situ monitoring of process and product parameters. To date, however, in-situ monitoring of process and product parameters has not been adapted to RTT.

SUMMARY OF THE INVENTION

It is therefore an object of the present invention to measure and analyze key process and product parameters in laser thermal transfer for improving the yield and quality of OLED devices.

It is another object of the invention to ensure that transfer of donor material in radiation thermal transfer processing has occurred and is of sufficient quality to continue processing.

It is yet another object of the invention to provide a way to utilize in-situ measurement data to compensate and thus improve the yield and throughput of acceptable products through radiation thermal transfer.

This object is achieved by a method of making an OLED device that corrects for potential defect(s) identified in one processing station by adjusting a subsequent processing station, comprising:

a) processing an OLED substrate by adding at least one organic layer and measuring in-situ one or more parameters associated with such organic layer to produce a signal representative of potential defect(s) in a produced OLED device; and b) adjusting in a subsequent processing station in response to the signal to change the formation of a subsequent organic layer added to the OLED device to compensate for the potential defect(s).

ADVANTAGES

It is an advantage of this invention that it permits less waste and additional throughput in the manufacture of OLED devices, thus increasing the efficiency of the manufacturing process. In-situ monitoring is important in determining whether a transfer of material has occurred and in ensuring the quality of the transfer. Further, in-situ monitoring eliminates any potential contamination that can occur during ex-situ testing. In-situ process and product parameter monitoring can enable compensations to be made in processes that occur downstream during the OLED manufacturing process, thereby improving yield and increasing throughput.

Since device feature dimensions such as layer thicknesses are frequently in sub-micrometer ranges, the drawings are scaled for ease of visualization rather than dimensional accuracy.

DETAILED DESCRIPTION OF THE INVENTION

The term "display" or "display panel" is employed to designate a screen capable of electronically displaying video images or text. The term "pixel" is employed in its art-recognized usage to designate an area of a display panel that can be stimulated to emit light independently of other areas. The term "OLED device" is used in its art-recognized meaning of a display device comprising organic light-emitting diodes as pixels. A color OLED device emits light of at least one color. The term "multicolor" is employed to describe a display panel that is capable of emitting light of a different hue in different areas. In particular, it is employed to describe a display panel that is capable of displaying images of different colors. These areas are not necessarily contiguous. The term "full color" is employed to describe multicolor display panels that are capable of emitting in the red, green, and blue regions of the visible spectrum and displaying images in any hue or combination of hues. The red, green, and blue colors constitute the three primary colors from which all other colors can be generated by appropriately mixing these three primaries. The term "hue" refers to the intensity profile of light emission within the visible spectrum, with different hues exhibiting visually discernible differences in color. The pixel or subpixel is generally used to designate the smallest addressable unit in a display panel. For a monochrome display, there is no distinction between pixel or subpixel. The term "subpixel" is used in multicolor display panels and is employed to designate any portion of a pixel which can be independently addressable to emit a specific color. For example, a blue subpixel is that portion of a pixel which can be addressed to emit blue light. In a full-color display, a pixel generally comprises three primary-color subpixels, namely blue, green, and red. For the purposes of this invention, the terms "pixel" and "subpixel" will be used interchangeably. The term "pitch" is used to designate the distance separating two pixels or subpixels in a display panel. Thus, a subpixel pitch means the separation between two subpixels.

Figure 1:
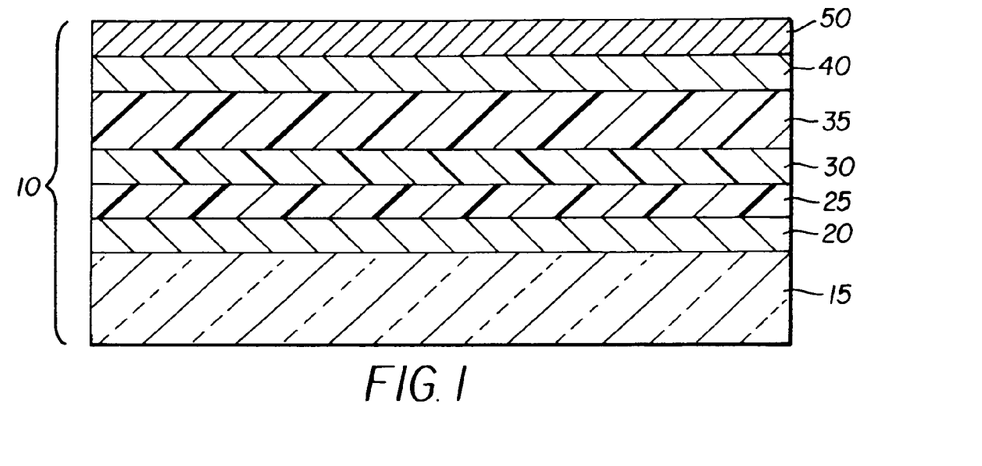
FIG. 1 shows a cross-sectional view of a pixel of an OLED device which can be used according to a first embodiment of the present invention.

Turning now to FIG. 1, there is shown a cross-sectional view of a pixel of an OLED device 10 which can be used according to a first embodiment of the present invention. In some embodiments, the pixel of OLED device 10 can be a subpixel as defined above. The pixel includes a substrate 15, an anode 20 disposed over substrate 15, and a cathode 50 spaced from anode 20. An optional hole-injecting layer 25 is disposed over anode 20, and hole-transporting layer 30 is disposed over hole-injecting layer 25. A light-emitting layer 35 is disposed over the hole-transporting layer 30. An electron-transporting layer 40 can be disposed over light-emitting layer 35. These layers will be described in more detail.

Substrate 15 can be an organic solid, an inorganic solid, or a combination of organic and inorganic solids that provides a surface for receiving organic material from a donor. Substrate 15 can be rigid or flexible and can be processed as separate individual pieces, such as sheets or wafers, or as a continuous roll. Typical substrate materials include glass, plastic, metal, ceramic, semiconductor, metal oxide, semiconductor oxide, semiconductor nitride, or combinations thereof. Substrate 15 can be a homogeneous mixture of materials, a composite of materials, or multiple layers of materials. Substrate 15 can be an OLED substrate, that is a substrate commonly used for preparing OLED devices, e.g. active-matrix low-temperature polysilicon TFT substrate. The substrate 15 can either be light transmissive or opaque, depending on the intended direction of light emission. The light transmissive property is desirable for viewing the EL emission through the substrate. Transparent glass or plastic are commonly employed in such cases. For applications where the EL emission is viewed through the top electrode, the transmissive characteristic of the bottom support is immaterial, and therefore can be light transmissive, light absorbing or light reflective. Substrates for use in this case include, but are not limited to, glass, plastic, semiconductor materials, ceramics, and circuit board materials, or any others commonly used in the formation of OLED devices, which can be either passive-matrix devices or active-matrix devices.

An electrode is formed over substrate 15 and is most commonly configured as an anode 20. When EL emission is viewed through the substrate 15, anode 20 should be transparent or substantially transparent to the emission of interest. Common transparent anode materials useful in this invention are indium-tin oxide and tin oxide, but other metal oxides can work including, but not limited to, aluminum- or indium-doped zinc oxide, magnesium-indium oxide, and nickel-tungsten oxide. In addition to these oxides, metal nitrides such as gallium nitride, metal selenides such as zinc selenide, and metal sulfides such as zinc sulfide, can be used as an anode material. For applications where EL emission is viewed through the top electrode, the transmissive characteristics of the anode material are immaterial and any conductive material can be used, transparent, opaque or reflective. Example conductors for this application include, but are not limited to, gold, iridium, molybdenum, palladium, and platinum. The preferred anode materials, transmissive or otherwise, have a work function of 4.1 eV or greater. Desired anode materials can be deposited by any suitable means such as evaporation, sputtering, chemical vapor deposition, or electrochemical means. Anode materials can be patterned using well known photolithographic processes.

While not always necessary, it is often useful that a hole-injecting layer 25 be formed over anode 20 in an organic light-emitting display. The hole-injecting material can serve to improve the film formation property of subsequent organic layers and to facilitate injection of holes into the hole-transporting layer. Suitable materials for use in hole-injecting layer 25 include, but are not limited to, porphyrinic compounds as described in U.S. Pat. No. 4,720,432, and plasma-deposited fluorocarbon polymers as described in U.S. Pat. No. 6,208,075. Alternative hole-injecting materials reportedly useful in organic EL devices are described in EP 0 891 121 A1 and EP 1,029,909 A1.

While not always necessary, it is often useful that a hole-transporting layer 30 be formed over the hole-injecting layer 25, or over anode 20 if no hole-injecting layer is used. Desired hole-transporting materials can be deposited by any suitable means such as evaporation, sputtering, chemical vapor deposition, electrochemical means, thermal transfer, or laser thermal transfer from a donor material. Hole-transporting materials useful in hole-transporting layer 30 are well known to include compounds such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al. in U.S. Pat. No. 3,180,730. Other suitable triarylamines substituted with one or more vinyl radicals and/or comprising at least one active hydrogen-containing group are disclosed by Brantley et al. in U.S. Pat. Nos. 3,567,450 and 3,658,520.

A more preferred class of aromatic tertiary amines are those which include at least two aromatic tertiary amine moieties as described in U.S. Pat. Nos. 4,720,432 and 5,061,569. Such compounds include those represented by structural Formula A.

A wherein:
$Q_1$ and $Q_2$ are independently selected aromatic tertiary amine moieties; and
G is a linking group such as an arylene, cycloalkylene, or alkylene group of a carbon to carbon bond.

In one embodiment, at least one of $Q_1$ or $Q_2$ contains a polycyclic fused ring structure, e.g., a naphthalene. When G is an aryl group, it is conveniently a phenylene, biphenylene, or naphthalene moiety.

A useful class of triarylamines satisfying structural Formula A and containing two triarylamine moieties is represented by structural Formula B.

B where:
$R_1$ and $R_2$ each independently represent a hydrogen atom, an aryl group, or an alkyl group or $R_1$ and $R_2$ together represent the atoms completing a cycloalkyl group; and
$R_3$ and $R_4$ each independently represent an aryl group, which is in turn substituted with a diaryl substituted amino group, as indicated by structural Formula C.

C wherein $R_5$ and $R_6$ are independently selected aryl groups. In one embodiment, at least one of $R_5$ or $R_6$ contains a polycyclic fused ring structure, e.g., a naphthalene.

Another class of aromatic tertiary amines are the tetraaryldiamines. Desirable tetraaryldiamines include two diarylamino groups, such as indicated by Formula C, linked through an arylene group. Useful tetraaryldiamines include those represented by Formula D.

D wherein:
each Are is an independently selected arylene group, such as a phenylene or anthracene moiety;
n is an integer of from 1 to 4; and
Ar, $R_7$, $R_8$, and $R_9$ are independently selected aryl groups.

In a typical embodiment, at least one of Ar, $R_7$, $R_8$, and $R_9$ is a polycyclic fused ring structure, e.g., a naphthalene.

The various alkyl, alkylene, aryl, and arylene moieties of the foregoing structural Formulae A, B, C, D, can each in turn be substituted. Typical substituents include alkyl groups, alkoxy groups, aryl groups, aryloxy groups, and halogens such as fluoride, chloride, and bromide. The various alkyl and alkylene moieties typically contain from 1 to about 6 carbon atoms. The cycloalkyl moieties can contain from 3 to about 10 carbon atoms, but typically contain five, six, or seven carbon atoms—e.g., cyclopentyl, cyclohexyl, and cycloheptyl ring structures. The aryl and arylene moieties are usually phenyl and phenylene moieties.

The hole-transporting layer in an OLED device can be formed of a single or a mixture of aromatic tertiary amine compounds. Specifically, one can employ a triarylamine, such as a triarylamine satisfying the Formula B, in combination with a tetraaryldiamine, such as indicated by Formula D. When a triarylamine is employed in combination with a tetraaryldiamine, the latter is positioned as a layer interposed between the triarylamine and the electron-injecting and transporting layer. Illustrative of useful aromatic tertiary amines are the following:

1, 1-Bis(4-di-p-tolylaminophenyl)cyclohexane
1,1-Bis(4-di-p-tolylaminophenyl)-4-phenylcyclohexane
4,4'-Bis(diphenylamino)quadriphenyl
Bis(4-dimethylamino-2-methylphenyl)-phenylmethane
N,N,N-Tri(p-tolyl)amine
4-(di-p-tolylamino)-4'-[4(di-p-tolylamino)-styryl]stilbene
N,N,N',N'-Tetra-p-tolyl-4-4'-diaminobiphenyl
N,N,N',N'-Tetraphenyl-4,4'-diaminobiphenyl
N-Phenylcarbazole
Poly(N-vinylcarbazole)
N,N'-di-1-naphthalenyl-N,N'-diphenyl-4,4'-diaminobiphenyl
4,4'-Bis[N-(1-naphthyl)-N-phenylamino]biphenyl
4,4"-Bis[N-(1-naphthyl)-N-phenylamino]$_p$-terphenyl
4,4'-Bis[N-(2-naphthyl)-N-phenylamino]biphenyl
4,4'-Bis[N-(3-acenaphthenyl)-N-phenylamino]biphenyl
1,5-Bis[N-(1-naphthyl)-N-phenylamino]naphthalene
4,4'-Bis[N-(9-anthryl)-N-phenylamino]biphenyl
4,4"-Bis[N-(1-anthryl)-N-phenylamino]-p-terphenyl
4,4'-Bis[N-(2-phenanthryl)-N-phenylamino]biphenyl
4,4'-Bis[N-(8-fluoranthenyl)-N-phenylamino]biphenyl
4,4'-Bis[N-(2-pyrenyl)-N-phenylamino]biphenyl
4,4'-Bis[N-(2-naphthacenyl)-N-phenylamino]biphenyl
4,4'-Bis[N-(2-perylenyl)-N-phenylamino]biphenyl
4,4'-Bis[N-(1-coronenyl)-N-phenylamino]biphenyl
2,6-Bis(di-p-tolylamino)naphthalene
2,6-Bis[di-(1-naphthyl)amino]naphthalene
2,6-Bis[N-(1-naphthyl)-N-(2-naphthyl)amino]naphthalene
N,N,N',N'-Tetra(2-naphthyl)-4,4"-diamino-p-terphenyl
4,4'-Bis{N-phenyl-N-[4-(1-naphthyl)-phenyl]amino}biphenyl
4,4'-Bis[N-phenyl-N-(2-pyrenyl)amino]biphenyl
2,6-Bis[N,N-di(2-naphthyl)amine]fluorene
1,5-Bis[N-(1-naphthyl)-N-phenylamino]naphthalene

Another class of useful hole-transporting materials includes polycyclic aromatic compounds as described in EP 1 009 041. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS.

Light-emitting layer 35 produces light in response to hole-electron recombination. Light-emitting layer 35 is formed over anode 20 and over any other layers formed, such as hole-transporting layer 30. Desired organic light-emitting materials can be deposited by any suitable means such as evaporation, sputtering, chemical vapor deposition, electrochemical means, or radiation thermal transfer from a donor material. Useful organic light-emitting materials are well known. As more fully described in U.S. Pat. Nos. 4,769,292 and 5,935,721, the light-emitting layers of the organic EL element comprise a luminescent or fluorescent material where electroluminescence is produced as a result of electron-hole pair recombination in this region. The light-emitting layers can be comprised of a single material, but more commonly include a host material doped with a guest compound or dopant where light emission comes primarily from the dopant and can be of any color. The host materials in the light-emitting layers can be an electron-transporting material, as defined below, a hole-transporting material, as defined above, or another material that supports hole-electron recombination. The dopant is usually chosen from highly fluorescent dyes, but phosphorescent compounds, e.g., transition metal complexes as described in WO 98/55561, WO 00/18851, WO 00/57676, and WO 00/70655 are also useful. Dopants are typically coated as 0.01 to 10% by weight into the host material.

An important relationship for choosing a dye as a dopant is a comparison of the bandgap potential which is defined as the energy difference between the highest occupied molecular orbital and the lowest unoccupied molecular orbital of the molecule. For efficient energy transfer from the host material to the dopant molecule, a necessary condition is that the band gap of the dopant is smaller than that of the host material.

Host and emitting molecules known to be of use include, but are not limited to, those disclosed in U.S. Pat. Nos. 4,768,292; 5,141,671; 5,150,006; 5,151,629; 5,294,870; 5,405,709; 5,484,922; 5,593,788; 5,645,948; 5,683,823; 5,755,999; 5,928,802; 5,935,720; 5,935,721; and 6,020,078.

Metal complexes of 8-hydroxyquinoline and similar derivatives (Formula E) constitute one class of useful host materials capable of supporting electroluminescence, and are particularly suitable for light emission of wavelengths longer than 500 nm, e.g., green, yellow, orange, and red.

E wherein:
M represents a metal;
n is an integer of from 1 to 3; and
Z independently in each occurrence represents the atoms completing a nucleus having at least two fused aromatic rings.

From the foregoing it is apparent that the metal can be a monovalent, divalent, or trivalent metal. The metal can, for example, be an alkali metal, such as lithium, sodium, or potassium; an alkaline earth metal, such as magnesium or calcium; or an earth metal, such as boron or aluminum. Generally any monovalent, divalent, or trivalent metal known to be a useful chelating metal can be employed.

Z completes a heterocyclic nucleus containing at least two fused aromatic rings, at least one of which is an azole or azine ring. Additional rings, including both aliphatic and aromatic rings, can be fused with the two required rings, if required. To avoid adding molecular bulk without improving on function the number of ring atoms is usually maintained at 18 or less.

Illustrative of useful chelated oxinoid compounds are the following:

CO-1: Aluminum trisoxine [alias, tris(8-quinolinolato)aluminum(III)]
CO-2: Magnesium bisoxine [alias, bis(8-quinolinolato)magnesium(II)]
CO-3: Bis[benzo{f}-8-quinolinolato]zinc(II)
CO-4: Bis(2-methyl-8-quinolinolato)aluminum(III)-μ-oxo-bis(2-methyl-8-quinolinolato)aluminum(III)
CO-5: Indium trisoxine [alias, tris(8-quinolinolato)indium]
CO-6: Aluminum tris(5-methyloxine) [alias, tris(5-methyl-8-quinolinolato)aluminum(III)]
CO-7: Lithium oxine [alias, (8-quinolinolato)lithium(I)]

Derivatives of 9,10-di-(2-naphthyl)anthracene (Formula F) constitute one class of useful host materials capable of supporting electroluminescence, and are particularly suit- able for light emission of wavelengths longer than 400 nm, e.g., blue, green, yellow, orange or red.

F wherein $R^1$, $R^2$, $R^3$, $R^4$, $R^5$, and $R^6$ represent one or more substituents on each ring where each substituent is individually selected from the following groups:
Group 1: hydrogen, or alkyl of from 1 to 24 carbon atoms;
Group 2: aryl or substituted aryl of from 5 to 20 carbon atoms;
Group 3: carbon atoms from 4 to 24 necessary to complete a fused aromatic ring of anthracenyl, pyrenyl, or perylenyl;
Group 4: heteroaryl or substituted heteroaryl of from 5 to 24 carbon atoms as necessary to complete a fused heteroaromatic ring of furyl, thienyl, pyridyl, quinolinyl or other heterocyclic systems;
Group 5: alkoxylamino, alkylamino, or arylamino of from 1 to 24 carbon atoms; and
Group 6: fluorine, chlorine, bromine or cyano.

Benzazole derivatives (Formula G) constitute another class of useful host materials capable of supporting electroluminescence, and are particularly suitable for light emission of wavelengths longer than 400 nm, e.g., blue, green, yellow, orange or red.

G where:
n is an integer of 3 to 8;
Z is O, NR or S;
R' is hydrogen; alkyl of from 1 to 24 carbon atoms, for example, propyl, t-butyl, heptyl, and the like; aryl or heteroatom substituted aryl of from 5 to 20 carbon atoms for example phenyl and naphthyl, furyl, thienyl, pyridyl, quinolinyl and other heterocyclic systems; or halo such as chloro, fluoro; or atoms necessary to complete a fused aromatic ring; and
L is a linkage unit including alkyl, aryl, substituted alkyl, or substituted aryl, which conjugately or unconjugately connects the multiple benzazoles together.

An example of a useful benzazole is 2,2',2''-(1,3,5-phenylene)tris[1-phenyl-1H-benzimidazole].

Desirable fluorescent dopants include derivatives of anthracene, tetracene, xanthene, perylene, rubrene, coumarin, rhodamine, quinacridone, dicyanomethylenepyran compounds, thiopyran compounds, polymethine compounds, pyrilium and thiapyrilium compounds, and carbostyryl compounds. Illustrative examples of useful dopants include, but are not limited to, the following:

L1

L2

L3

L4

-continued

L5

L6

L7

L8

-continued

| | X | R1 | R2 |
|---|---|---|---|
| L9 | O | H | H |
| L10 | O | H | Methyl |
| L11 | O | Methyl | H |
| L12 | O | Methyl | Methyl |
| L13 | O | H | t-butyl |
| L14 | O | t-butyl | H |
| L15 | O | t-butyl | t-butyl |
| L16 | S | H | H |
| L17 | S | H | Methyl |
| L18 | S | Methyl | H |
| L19 | S | Methyl | Methyl |
| L20 | S | H | t-butyl |
| L21 | S | t-butyl | H |
| L22 | S | t-butyl | t-butyl |

| | X | R1 | R2 |
|---|---|---|---|
| L23 | O | H | H |
| L24 | O | H | Methyl |
| L25 | O | Methyl | H |
| L26 | O | Methyl | Methyl |
| L27 | O | H | t-butyl |
| L28 | O | t-butyl | H |
| L29 | O | t-butyl | t-butyl |
| L30 | S | H | H |
| L31 | S | H | Methyl |
| L32 | S | Methyl | H |
| L33 | S | Methyl | Methyl |
| L34 | S | H | t-butyl |

-continued

| | | | |
|---|---|---|---|
| L35 | S | t-butyl | H |
| L36 | S | t-butyl | t-butyl |

| | R |
|---|---|
| L37 | phenyl |
| L38 | methyl |
| L39 | t-butyl |
| L40 | mesity |

| | R |
|---|---|
| L41 | phenyl |
| L42 | methyl |
| L43 | t-butyl |
| L44 | mesityl |

L45

L46

-continued

L47

L48

Other organic emissive materials can be polymeric substances, e.g. polyphenylenevinylene derivatives, dialkoxy-polyphenylenevinylenes, poly-para-phenylene derivatives, and polyfluorene derivatives, as taught by Wolk et al. in commonly assigned U.S. Pat. No. 6,194,119 BI and references cited therein.

Although not shown, the device can additionally comprise more than two emissive layers, if such is desired for proper emissive properties of the resulting OLED device.

While not always necessary, it is often useful that an electron-transporting layer 40 be formed over light-emitting layer 35. Desired electron-transporting materials can be deposited by any suitable means such as evaporation, sputtering, chemical vapor deposition, electrochemical means, thermal transfer, or laser thermal transfer from a donor material. Preferred electron-transporting materials for use in electron-transporting layer 40 are metal chelated oxinoid compounds, including chelates of oxine itself (also commonly referred to as 8-quinolinol or 8-hydroxyquinoline).

Such compounds help to inject and transport electrons and exhibit both high levels of performance and are readily fabricated in the form of thin films. Exemplary of contemplated oxinoid compounds are those satisfying structural Formula E, previously described.

Other electron-transporting materials include various butadiene derivatives as disclosed in U.S. Pat. No. 4,356,429 and various heterocyclic optical brighteners as described in U.S. Pat. No. 4,539,507. Benzazoles satisfying structural Formula G are also useful electron-transporting materials.

Other electron-transporting materials can be polymeric substances, e.g. polyphenylenevinylene derivatives, poly-para-phenylene derivatives, polyfluorene derivatives, polythiophenes, polyacetylenes, and other conductive polymeric organic materials such as those listed in *Handbook of Conductive Molecules and Polymers*, Vols. 1–4, H. S. Nalwa, ed., John Wiley and Sons, Chichester (1997).

It will be understood that, as is common in the art, some of the layers described above can have more than one function. For example, light-emitting layer 35 can have hole-transporting properties or electron-transporting properties as desired for performance of the OLED device. Hole-transporting layer 30 or electron-transporting layer 40, or both, can have emitting properties. In such a case, fewer layers can be sufficient for the desired emissive properties.

Cathode 50 is formed over the electron-transporting layer 40 or over light-emitting layers 35 if an electron-transporting layer is not used. When light emission is through the anode 20, the cathode material can be comprised of nearly any conductive material. Desirable materials have good film-forming properties to ensure good contact with the underlying organic layer, promote electron injection at low voltage, and have good stability. Useful cathode materials often contain a low work function metal (<3.0 eV) or metal alloy. One preferred cathode material is comprised of a Mg:Ag alloy wherein the percentage of silver is in the range of 1 to 20%, as described in U.S. Pat. No. 4,885,221. Another suitable class of cathode materials includes bilayers comprised of a thin layer of a low work function metal or metal salt capped with a thicker layer of conductive metal. One such cathode is comprised of a thin layer of LiF followed by a thicker layer of Al as described in U.S. Pat. No. 5,677,572. Other useful cathode materials include, but are not limited to, those disclosed in U.S. Pat. Nos. 5,059,861; 5,059,862; and 6,140,763.

When light emission is viewed through the cathode, the cathode must be transparent or nearly transparent. For such applications, metals must be thin or one must use transparent conductive oxides, or a combination of these materials. Optically transparent cathodes have been described in more detail in U.S. Pat. No. 5,776,623. Cathode materials can be deposited by evaporation, sputtering, or chemical vapor deposition. When needed, patterning can be achieved through many well known methods including, but not limited to, through-mask deposition, integral shadow masking as described in U.S. Pat. No. 5,276,380 and EP 0 732 868, laser ablation, and selective chemical vapor deposition.

Cathode 50 is an electrode vertically spaced apart from anode 20. Cathode 50 can be part of an active matrix device and in that case is a single electrode for the entire display. Alternatively, cathode 50 can be part of a passive matrix device, in which each cathode 50 can activate a column of pixels, and cathodes 50 are arranged orthogonal to anodes 20.

An electron-injecting layer can also be present between the cathode and the electron-transporting layer. Examples of electron-injecting materials include alkali halide salts, such as LiF mentioned above.

Figure 2:
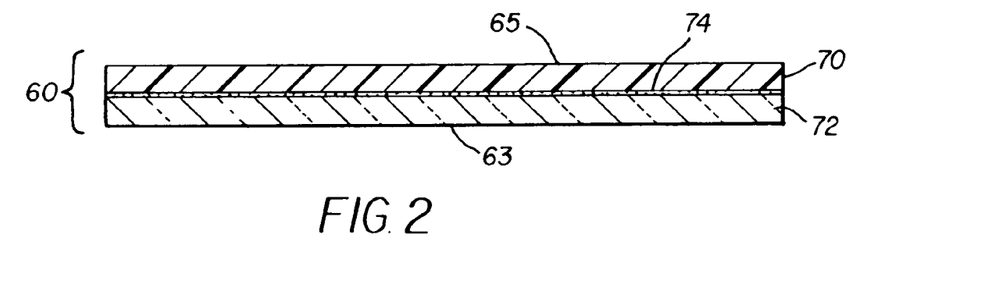
FIG. 2 shows a cross-sectional representation of one embodiment of the structure of a donor that can be used in the method described herein.

Turning now to FIG. 2, there is shown a cross-sectional representation of one embodiment of the structure of a donor 60 that can be used in the method and apparatus described herein. Donor 60 can be formed in a sheet or as a continuous roll. Donor 60 includes at the minimum a support 72 that is preferably flexible, which comprises non-transfer surface 63. Support 72 is first uniformly coated with radiation-absorbing layer 74 that includes a radiation-absorbing material capable of absorbing radiation in a predetermined portion of the spectrum to produce heat so as to cause the transfer of organic material, then coated with a layer of heat-transferable organic material 70. Support 72 then comprises non-transfer surface 63 of donor 60 and organic material 70 comprises transfer surface 65 of donor 60. Radiation-absorbing layer 74 is capable of absorbing radiation in a predetermined portion of the spectrum thereby producing heat. The radiation-absorbing material can be a dye such as the dyes specified in U.S. Pat. No. 5,578,416, a pigment such as carbon, or a metal such as nickel, chromium, titanium, etc.

Support 72 can be made of any of several materials which meet at least the following requirements. It must be capable of maintaining it's structural integrity during the organic material transfer step while it is pressurized on one side, and during any pre-treat heating steps contemplated to remove volatile constituents such as water vapor. Additionally, support 72 must be capable of receiving on one surface a relatively thin coating of organic material 70, and of retaining this coating without degradation during anticipated storage periods of the coated support (donor 60). Support materials meeting these requirements include, for example, metal foils, certain plastic foils which exhibit a glass transition temperature value higher than a support temperature value anticipated to cause transfer of the transferable organic material 70 coated on support 72, and fiber-reinforced plastic foils. While selection of suitable support materials can rely on known engineering approaches, it will be appreciated that certain aspects of a selected support material merit further consideration when configured as a donor support useful in the practice of the invention. For example, support 72 can require a multi-step cleaning and surface preparation process prior to precoating with radiation-absorbing layer 74 or organic material 70.

Figure 3:
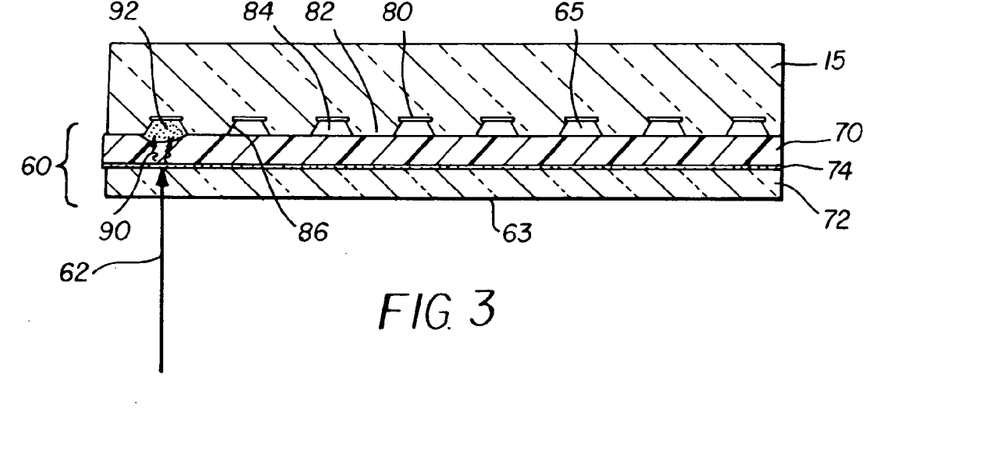
FIG. 3 is a cross-sectional view of one embodiment of the placement of a donor against a substrate in accordance with this invention.

FIG. 3 shows a cross-section view of one embodiment of the placement of donor 60 against substrate 15 in accordance with this invention. In this embodiment, receiving surface 86 of substrate 15 is uneven due to the presence of thin-film transistors 80. Thin-film transistors 80 are separated in substrate 15 by raised surface portions 82 as a result of the multilayer construction of each pixel or subpixel. This is described by Tang in commonly assigned U.S. Pat. No. 5,937,272, the disclosure of which is incorporated herein by reference. The presence of raised surface portions 82 maintains the separation of gap 84 against the pressure that is exerted by the pressurizing fluid against non-transfer surface 63 and maintains a separation between portions of donor 60 and substrate 15.

FIG. 3 also shows the process of using radiation to transfer organic material 70 from donor 60 to portions of substrate 15. A pattern of radiation such as laser light beam 62 irradiates non-transfer surface 63. Heat 90 is produced when laser light beam 62 strikes radiation-absorbing layer 74, permitting heat 90 to be absorbed by organic material 70 in the immediate vicinity of laser light beam 62, which causes the transfer of organic material 70 to substrate 15. A large portion of the light impinging on donor 60 will be converted to heat, but this will only happen at selectively irradiated portions of donor 60. Some or all of the heated portion of organic material 70 undergoes organic material transfer, that is, it is sublimed, vaporized, or ablated and becomes organic layer 92 on receiving surface 86 of substrate 15 in a patterned transfer.

Defects are possible during this process. For example, a portion of organic material 70 can be missing or of a reduced thickness, thus being a defect in donor 60. Such a defective portion of donor 60 can lead to a defect in organic layer 92 upon the radiation thermal transfer process. Also, an inefficient radiation thermal transfer process can lead to incomplete organic material transfer and a defect in organic layer 92 on OLED substrate 15. For example, the thickness of organic layer 92 can be insufficient for proper electroluminescence. Such a defect in organic layer 92 will also be referred to herein as a potential defect in the produced OLED device.

Figure 4:
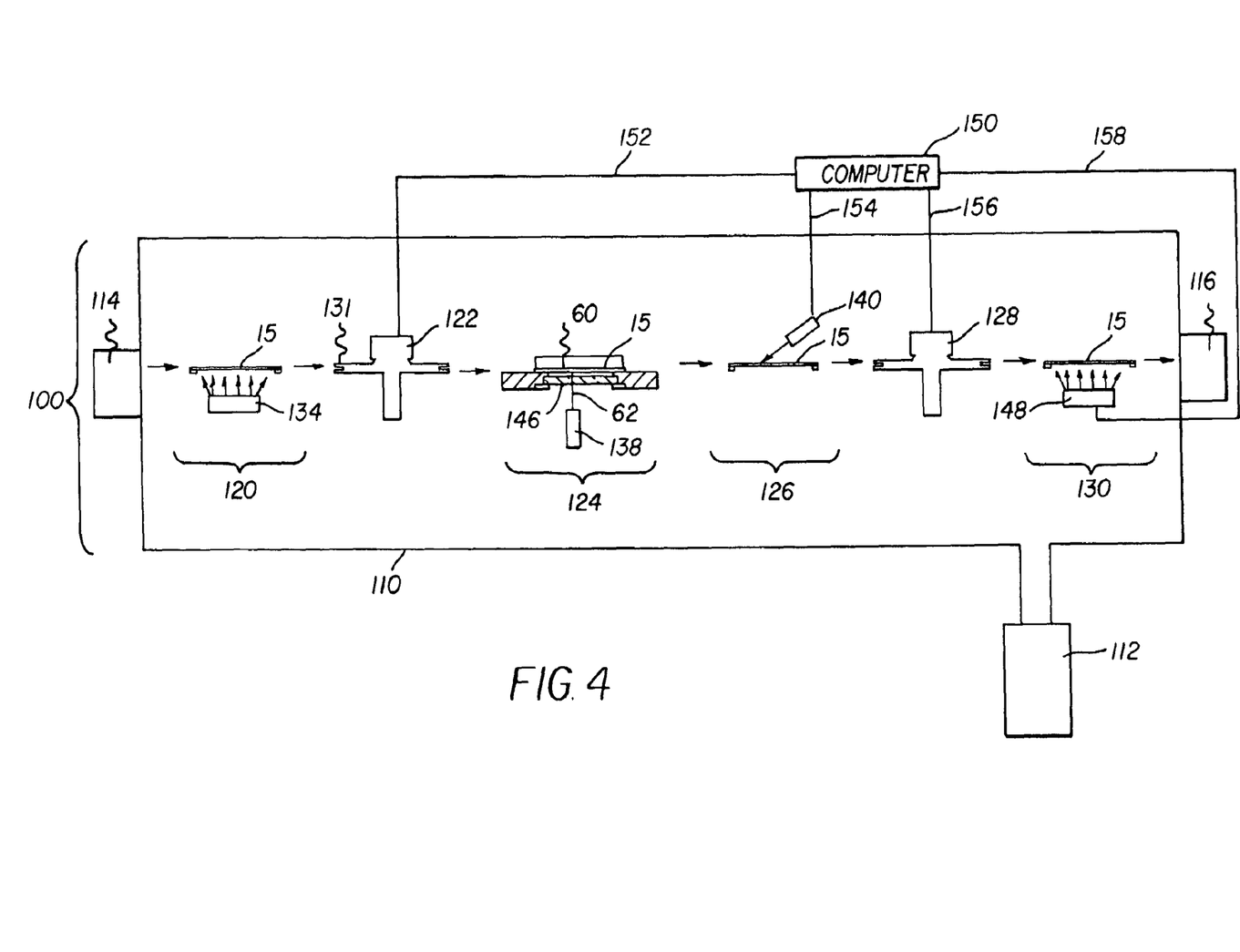
FIG. 4 is a cross-sectional representation of one embodiment of an apparatus that can be used to effect the method of this invention.

Turning now to FIG. 4, we see a cross-sectional representation of one embodiment of an apparatus that can be used to effect the method of this invention in which an OLED substrate 15 is coated in three processing stations in the same controlled environment coater 100. Controlled environment coater 100 is an enclosed apparatus described herein that permits an in-situ method for fabricating an OLED device under controlled-environment conditions and includes unitary housing 110 which encompasses three coating stations, at least one of which is a radiation thermal transfer station, a measurement station, and one or more robots. By controlled environment, we mean that the water vapor partial pressure is preferably 1 Torr or less, or the oxygen partial pressure is preferably 1 Torr or less, or both. This can be accomplished by maintaining a vacuum inside the controlled environment coater 100. This can also be accomplished by maintaining a water vapor level of preferably 1000 ppm or less, or an oxygen level of preferably 1000 ppm or less, or both, at a total pressure greater than 1 Torr inside controlled environment coater 100. While controlled environment coater 100 is shown as a single chamber, it can also include two or more chambers in which at least one chamber is maintained under a vacuum, and at least one chamber is maintained under a higher-pressure controlled environment as described above. Such an apparatus has been described previously in commonly assigned U.S. patent application Ser. No. 10/141,587 filed May 8, 2002 by Michael L. Boroson et al., entitled "In-Situ Method for Making OLED Devices That Are Moisture or Oxygen-Sensitive", the disclosure of which is herein incorporated by reference. While it is impossible to reduce the quantities of water vapor and/or oxygen completely to zero, controlled environment conditions can reduce the quantities of these components to very low or imperceptible levels, such as 0.001 ppm. Controlling the environment can be achieved by various well known methods, e.g. oxygen or water-vapor scrubbers, or the use of purified gasses. Controlled environment coater 100 can include one chamber, or any number of chambers that can be connected by load locks or similarly-acting apparatus such as tunnels or buffer chambers, whereby donor elements and receiver elements can be transported without exposure to moisture and/or oxygen. The conditions are maintained in controlled environment coater 100 by a means for controlling the atmosphere, e.g. controlled environment source 112. Controlled environment coater 100 can include load lock 114, which is used to load substrates 15, and load lock 116, which is used to unload completed OLED devices. Several embodiments of controlled environment coater 100 have been more fully described in commonly assigned U.S. patent application Ser. No. 10/141,587 filed May 8, 2002 by Michael L. Boroson et al., entitled "In-Situ Method for Making OLED Devices That Are Moisture or Oxygen-Sensitive", the disclosure of which is herein incorporated by reference.

The interior of this embodiment of controlled environment coater 100 can include coating station 120, robots 122 and 128, radiation thermal transfer station 124, measurement station 126, and coating station 130. Coating station 120, radiation thermal transfer station 124, and coating station 130 are processing stations. In this embodiment, the stations are sequentially positioned in line, so that a substrate 15 can be sequentially moved in line through the different stations. Coating station 120 is a means for coating one or more organic layers over a substrate 15 e.g. a structure for applying a hole-transporting material over the substrate 15 by e.g. vapor deposition or other substantially uniform means. Coating means or coating apparatus 134 can represent e.g. a heated boat, a point vapor source, etc. It will be understood that other coating methods are possible, e.g. solvent coating, and that the relative positions of substrate 15 above or below coating apparatus 134 will depend on the type of coating. Coating station 120 can coat one or more organic layers on substrate 15. For example, the use of two or more coating apparatus 134, movable in relation to substrate 15, will permit multiple organic layers to be coated.

Controlled environment coater 100 also includes a robot 122. Robot 122 is an actuable robot control means for grasping and removing substrate 15 from coating station 120 after substrate 15 has been coated, and positioning coated substrate 15 into radiation thermal transfer station 124 so that it is in a material transferring relationship with donor 60. For the purposes of this discussion, a robot shall include the apparatus necessary to move a web in the case where substrate 15 is in the form of a continuous web or roll. Robot 122 can include a grasping means 131 by which it can grasp and remove substrate 15 from coating station 120 and position the coated substrate 15 in radiation thermal transfer station 124.

Radiation thermal transfer station 124 is a processing station that processes OLED substrate 15 by adding at least one organic layer by a radiation thermal transfer process. It can hold substrate 15 in a material transferring relationship with donor 60, which includes light-emitting organic material. Radiation thermal transfer station 124 can be e.g. an apparatus such as that described in commonly assigned U.S. patent application Ser. No. 10/021,410 filed Dec. 12, 2001 by Bradley A. Phillips et al., entitled "Apparatus for Permitting Transfer of Organic Material From a Donor to Form a Layer in an OLED Device", the disclosures of which are herein incorporated by reference. Radiation thermal transfer station 124 is shown for convenience in the closed configuration, but it also has an open configuration in which the donor 60 and substrate 15 loading and unloading occurs. By material transferring relationship we mean the coated side of donor 60 is positioned in close contact with the receiving surface of substrate 15 and held in place by a means such as fluid pressure in a pressure chamber, as described by Phillips, et al. Radiation thermal transfer station 124 is constructed so as to facilitate forming an emissive layer on substrate 15 through the selective transfer of organic material from donor 60 to substrate 15 by applying radiation from an actuable radiation means, e.g. laser light beam 62 from laser 138, through transparent portion 146. Radiation thermal transfer is herein defined as any mechanism such as sublimation, ablation, vaporization or other process whereby material can be transferred upon initiation by radiation. The irradiation of donor 60 in a predetermined pattern selectively transfers one or more layers of coated material from donor 60 to substrate 15 so that material will coat selected portions of substrate 15, as described by Phillips et al.

Controlled environment coater 100 also includes measurement station 126, which includes measurement apparatus 140. Measurement apparatus 140 is an apparatus capable of measuring in-situ one or more parameters (e.g. thickness) associated with an organic layer such as light-emitting layer 35 coated on OLED substrate 15 to produce a signal representative of potential defects in OLED device 10. Measurement apparatus 140 can thereby identify potential defects in one processing station (e.g. radiation thermal transfer station 124) and produce a signal representative of the potential defects. Such a measurement apparatus 140 can be e.g. in-situ spectroscopic ellipsometry, which is commercially available from J. A. Woolam Co., Inc., and others. Other methods of measurement are also possible, and can include destructive tests that are performed on test sites that will not be utilized in the final OLED display device (e.g. near the edge of a panel), or non-destructive tests that can be performed anywhere on OLED substrate 15. Destructive in-situ tests that can be performed on test sites can include photoluminescence to check the quality of the transferred material layer, Kelvin probe testing to measure the work function of the transferred material layer, atomic force microscopy (AFM) tests to determine the thickness and resolution of the transferred material layer, laser desorption mass spectroscopy to determine impurities, micro-Raman spectroscopy, X-ray fluorescence, or four point probe measurements. Nondestructive in-situ tests can include diffracting a laser beam off of a set of lines that form a grating, or ellipsometry on the transferred material to ascertain transfer layer thickness and density.

Controlled environment coater 100 also includes coating station 130, which is a means for forming an electron-transporting layer over the first and second organic layers of emissive coated substrate 15 that had been previously coated in coating station 120 and radiation thermal transfer station 124. Coating apparatus 148 can represent e.g. one or more heated boats for vaporizing materials to form the desired layer.

These operations can be simultaneous at the various stations. For example, a substrate 15 can undergo radiation thermal transfer at radiation thermal transfer station 124, while a previously-transferred substrate 15 is being coated at coating station 130, another previously-transferred substrate 15 is being measured at measurement station 126, and an uncoated substrate 15 is being coated at coating station 120.

A process control means, e.g. computer 150 can be arranged to control this process via data input/outputs 152, 154, 156, and 158. Robots 122 and 128 can be controlled by computer 150 via data input/outputs 152 and 158, respectively. Of particular importance to this method is that computer 150 controls measurement apparatus 140, and receives a signal representative of potential defects in coated substrate 15, via data input/output 154. Computer 150 can then adjust one or more subsequent steps or one or more subsequent processing stations in response to the signal to change the formation of a subsequent organic layer added to OLED substrate 15 to compensate for potential defects. For example, if a defect is detected in substrate 15 by measurement apparatus 140, computer 150 can adjust the subsequent processing station, that is coating station 130, in response to the defect signal, thereby changing the formation of the subsequent organic layer (e.g. the electron-transporting layer 40) added to OLED substrate 15 at coating station 130. For example, if the signal from measurement apparatus 140 indicates an undesired thickness of the OLED layer(s), computer 150 can adjust the thickness of the subsequent organic layer deposited at coating station 130. Such adjustment can be effected by e.g. changing the rate of vaporization from coating apparatus 148, or by changing the residence time of OLED substrate 15 in coating station 130.

Alternatively, computer 150 can control robot 128 to reject the device if there is a defect, e.g. if insufficient organic material was transferred, so that OLED substrate 15 is not passed to coating station 130, but is removed from the system. Alternatively, computer 150 can control robot 128 to transfer the rejected device to a reworking station that can rework rejected OLED substrate 15 to correct for identified defects, e.g. to correct for insufficient organic material transfer. A reworking station can be an additional station, or can be radiation thermal transfer station 124 to which substrate 15 can be returned for reworking to correct for identified defects, such reworking can include radiation thermal transfer of an organic layer to the defective locations of substrate 15 using an additional donor 60.

Although not shown, computer 150 can also be a process control means for controlling in a time sequence the actuation of the coating means, that is stations 120, 124, and 130, respectively. Computer 150 can also control the actuable radiation means, that is laser 138.

Although FIG. 4 shows a system comprising three coating stations and one measurement station in a particular order, those skilled in the art will understand that this invention is not limited to this arrangement. For example, a measurement station can be located before radiation thermal transfer station 124 for testing donor 60. Such an arrangement would permit a donor 60 with defects or defective portions to be rejected before it is used to produce an unacceptable OLED device from OLED substrate 15. Alternatively, the identified defective portions of donor 60 can be excluded in the process to form an organic layer on OLED substrate 15, thus transferring organic material 70 only from acceptable portions of donor 60 and reducing waste for OLED substrates 15. This is a particularly effective method if donor 60 is in the form of a continuous web, but can also be used if donor 60 is in the form of sheets. Particularly effective methods for testing donor 60 in this invention include in-situ spectroscopic ellipsometry, automated image analysis, and automated absorption and transmission measurements.

Figure 5:
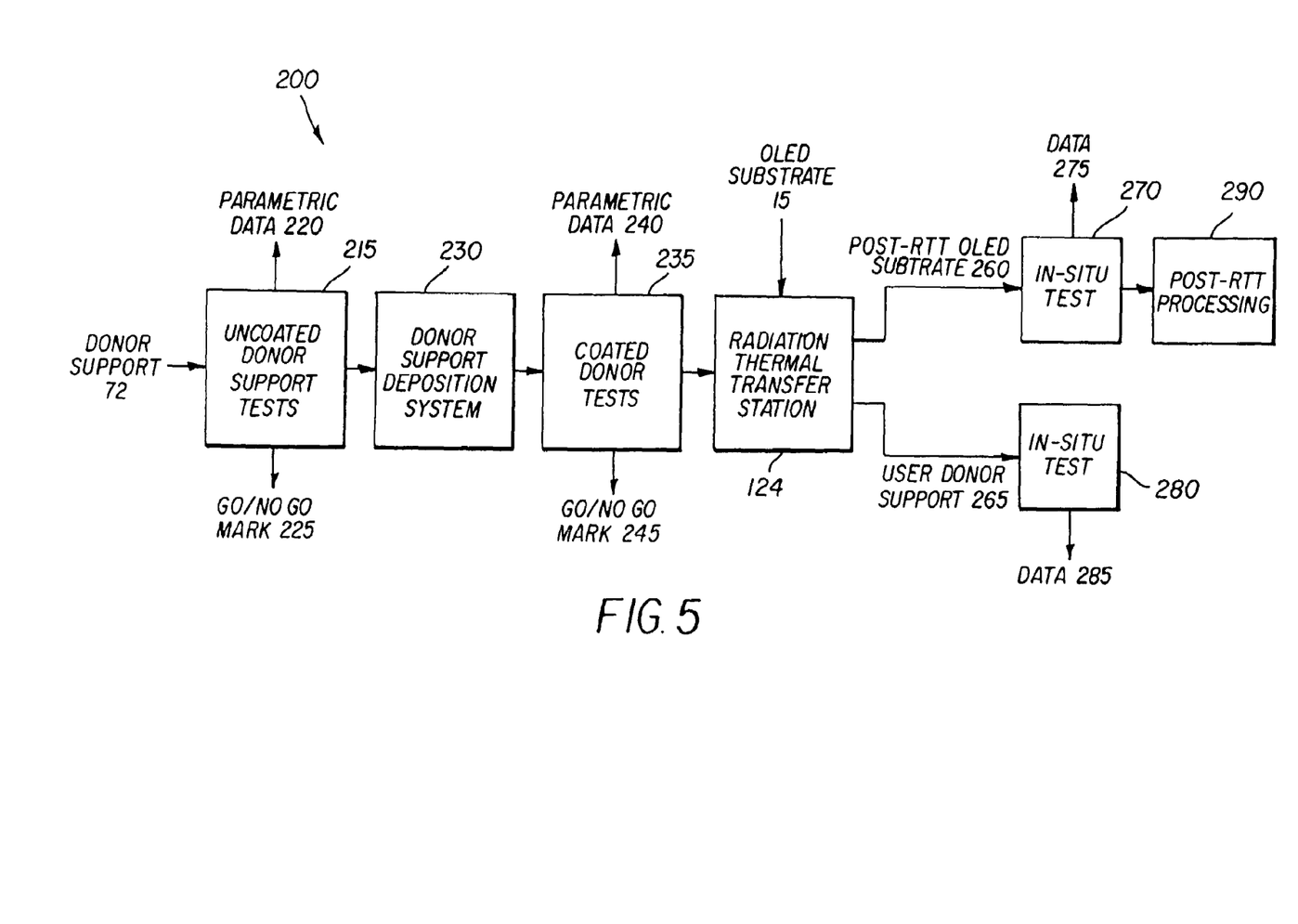
FIG. 5 illustrates a process flow in accordance with the present invention for the in-situ characterization of process parameters for a radiation thermal transfer deposition process.

FIG. 5 illustrates a process flow 200 in accordance with the present invention for the in-situ characterization of process parameters for a radiation thermal transfer deposition process. Process flow 200 includes a donor support 72 that can be a continuous roll of extruded web that is, in one example, 3 mils thick, 22 inches wide, and hundreds of yards long; alternately, donor support 72 can be a plurality of precut and framed donor sheets. Although donor support 72 has been quality control-tested prior to being supplied to process flow 200, additional testing can be desirable in order to ascertain moisture content, contamination, deformities such as pinholes or non-uniform areas in the chromium light-absorbing layer, the thicknesses of the light-absorbing and antireflecting layers, etc. Therefore, donor support 72 can be subjected to one or more uncoated donor support tests 215 for testing donor support 72, which can include Fourier transform infrared spectroscopy (FTIR), that can provide moisture content information about donor support 72. A set of parametric data 220 for process feedback and a go/no-go mark 225 are derived from uncoated donor support tests 215. Go/no-go mark 225 can be e.g. a physical marking of good or bad sections, or can be computerized tracking of good or bad sections or parts.

Process flow 200 further includes a donor support deposition system 230, in which donor support 72 receives an organic coating that is used several steps later in process flow 200 during radiation thermal transfer to deposit organic material to an OLED substrate 15. Some examples of donor support deposition system 230 have been described by Boroson et al in commonly assigned U.S. Pat. No. 6,555,284, the contents of which are incorporated by reference. Process flow 200 can further include one or more coated donor tests 235 for testing donor 60, which can include Fourier transform infrared spectroscopy (FTIR), that can provide moisture content information about donor support 72, and ellipsometry, that can determine layer thicknesses of organic material 70, from which a set of parametric data 240 for process feedback and a go/no-go mark 245 are derived.

Process flow 200 further includes a radiation thermal transfer station 124 that transfers organic material 70 from the donor 60 to OLED substrate 15 using a radiation thermal transfer vacuum deposition process. Outputs from radiation thermal transfer station 124 include a post-RTT (post-radiation thermal transfer) OLED substrate 260 and a used donor support 265. Post-RTT OLED substrate 260 is the article of manufacture that results from the radiation thermal transfer deposition of organic material to OLED substrate 15. Used donor support 265 is the remains of the coated donor 60 after the radiation thermal transfer process.

Process flow 200 can further include: one or more first in-situ tests 270 that are performed upon post-RTT OLED substrate 260 for testing organic layer 92 from which a first set of data 275 is obtained, and one or more second in-situ tests 280 that are performed upon used donor support 265 and from which a second set of data 285 is obtained. Process flow 200 can further include post-RTT processing 290 that is performed upon post-RTT OLED substrate 260.

In operation, donor support 72 is manufactured offsite and supplied to process flow 200. Uncoated donor support tests 215 are conducted and result in parametric data 220, which can be used to determine which portions of donor support 72 are acceptable for further processing. The acceptable portions of donor support 72, and defective portions of donor support 72 can be noted in the memory of a software program (not shown) or can be used to provide a go/no-go mark 225 to donor support 72. Donor support 72 next enters donor support deposition system 230. Support 72 is coated to form donor 60. One or more coated donor tests 235 are subsequently performed on donor 60. The results of coated donor tests 235 are used to produce process control parametric data 240 and further can be used to provide a go/no-go mark 245 to donor 60. Coated donor tests 235 can include ellipsometry to determine the thicknesses of organic layer 92, material properties of the organic layer, dopant, and host concentrations, the presence of contaminants, etc. Using an area of donor 60 that is not going to be utilized for radiation thermal transfer enables coated donor tests 235 to include destructive testing methods such as photoluminescence or laser desorption mass spectroscopy. Defective portions of donor 60 as ascertained by parametric data 220 and 240 can be indexed and discarded later, enabling the translation of the defective portions of donor 60 to be sped up through the subsequent deposition processes. Alternately, if donor 60 is in the form of framed donor sheets, defective donors 60 can be discarded immediately.

Donor 60 next enters radiation thermal transfer station 124, in which the organic material 70 of donor 60 is transferred to OLED substrate 15. OLED substrate 15 can include previously deposited and tested layers, such as a hole-injecting layer and a hole-transporting layer as have been described above. Upon completion of the radiation thermal transfer processing, post-RTT OLED substrate 260 undergoes one or more first in-situ tests 270 from which first set of data 275 is derived. Concurrently, used donor support 265 undergoes one or more second in-situ tests 280 from which second set of data 285 is derived.

First in-situ tests 270 can occur within radiation thermal transfer station 124, e.g., by directing a laser beam through transparent portion 146 of radiation thermal transfer station 124 and onto the layer deposited atop OLED substrate 15, or subsequent to radiation thermal transfer station 124 such as in measurement station 126, and can include destructive tests performed on test sites that will not be utilized in the final OLED display device, such as near the edge of a panel, or nondestructive tests performed anywhere on post-RTT OLED substrate 260.

Destructive first in-situ tests 270 that are performed on test sites can include photoluminescence to check the quality of the transferred material layer, Kelvin probe testing to measure the work function of the transferred material layer, atomic force microscopy (AFM) tests to determine the thickness and resolution of the transferred material layer, laser desorption mass spectroscopy to determine impurities, micro-Raman spectroscopy, X-ray fluorescence, or four point probe measurements.

Nondestructive first in-situ tests 270 can include diffracting a laser beam off of a set of lines that form a grating. In this specific embodiment, the grating is deposited along with the organic material atop OLED substrate 15 in a test area of OLED substrate 15 during the radiation thermal transfer process. The grating is illuminated to produce a diffraction pattern, the first order of which is analyzed to yield an indication of the transfer amount and the resolution quality of the transfer. In addition to the quality of the transferred material layer, analyses of the diffraction pattern provided by the grating further yields information regarding the performance of radiation thermal transfer station 124. Nondestructive first in-situ tests 270 can further include spectroscopic ellipsometry on the transferred material to ascertain transfer layer thickness and density.

Second in-situ tests 280 that are performed on used donor support 265 can include any of the aforementioned nondestructive or destructive tests due to the fact that the used donor support 265 is spent and no longer of use, and can include utilizing the ghost of a transferred diffraction grating that, similar to the nondestructive testing described above, can produce an interference pattern. In addition, comparisons can be made between organic material 70 atop donor 60 and the organic material that is transferred to post-RTT OLED substrate 260 by comparing parametric data 240 and first set of data 275. Such combination analysis provides valuable information about how both donor support deposition system 230 and radiation thermal transfer station 124 are behaving. For example, if parametric data 240 describes a suitable layer of organic material atop donor support 72 while first set of data 275 describes an unsuitable thermal transfer of the organic material to OLED substrate 15, it is likely that the gap 84 provided between OLED substrate 15 and donor 60 during radiation thermal transfer is too large.

Upon undergoing first in-situ test 270, post-RTT OLED substrate 260 advances to post-RTT processing 290, which can specifically be chosen to be another thermal transfer of organic material. In one specific example, radiation thermal transfer is utilized to pattern each set of red, green, and blue pixels, in which case post-RTT OLED substrate 260 reenters process flow 200 illustrated in FIG. 5. In the case that no further radiation thermal transfer processing is necessary, post-RTT processing 290 can include more conventional deposition processes such as linear evaporation through a shadow mask or frame mask to deposit additional layers such as an electron-transporting layer or a cathode.

First in-situ tests 270 and second in-situ tests 280 can be performed upon each post-RTT OLED substrate 260 and each used donor support 265, respectively, that are used during process flow 200 or, alternately, a fraction of post-RTT OLED substrates 260 and used donor supports 265 used during process flow 200 can be tested, e.g., every tenth post-RTT OLED substrate 260 and used donor support 265. First set of data 275 and second set of data 285 can be further used to alter process parameters downstream to enable compensations to be made. This helps to increase yield and throughput of the radiation thermal transfer process via use of the collected information from first set of data 275 and second set of data 285.

Figure 6:
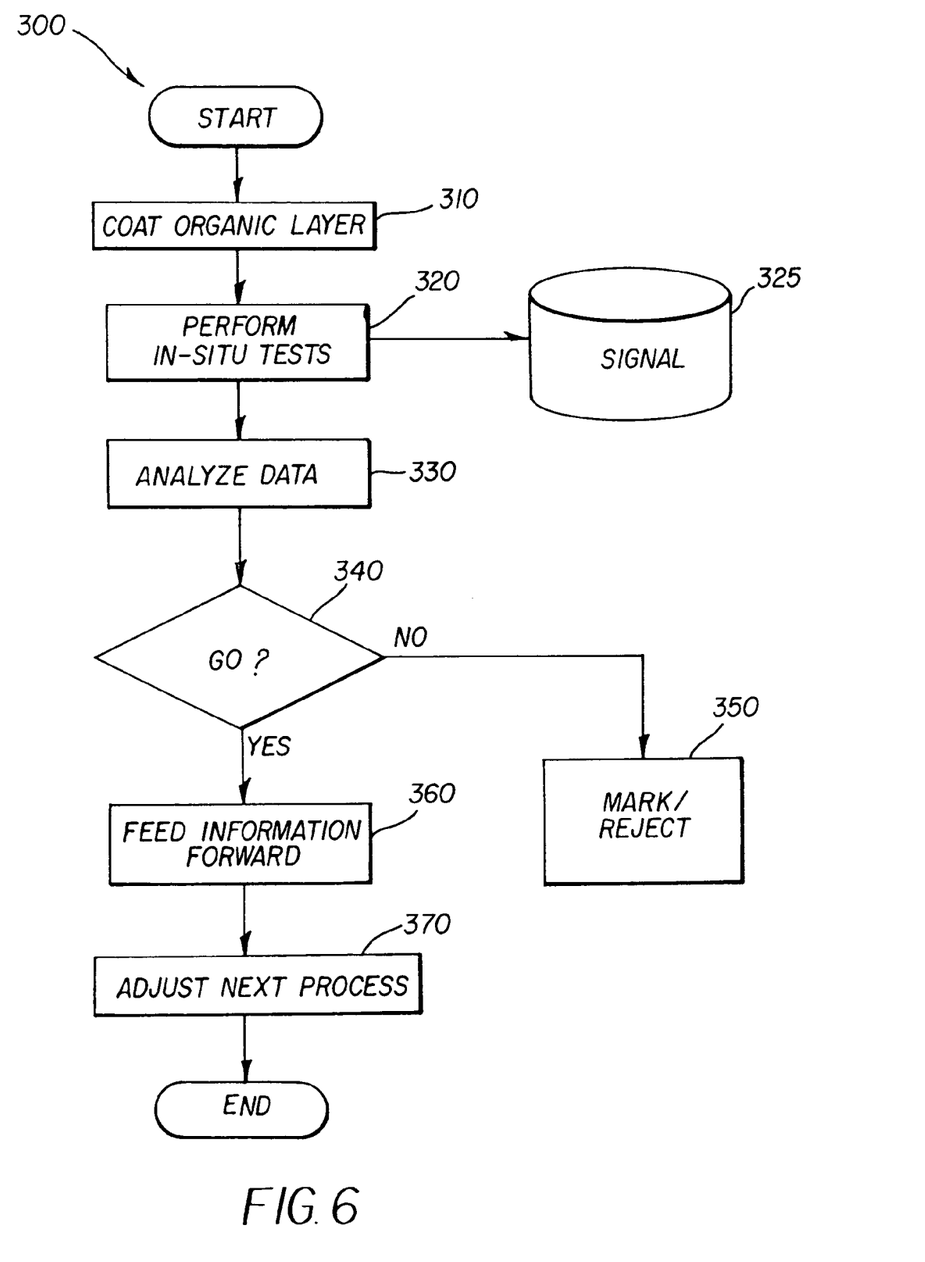
FIG. 6 is a block diagram of one embodiment of a method of making an OLED device in accordance with this invention.

Turning now to FIG. 6, there is shown a block diagram of one embodiment of a method 300 of making an OLED device in accordance with this invention that corrects for potential defects identified in one processing station by adjusting a subsequent processing step. Method 300 includes the following steps:

In step 310, an OLED substrate 15 is processed by adding at least one organic layer as described herein. Conveniently, the organic layer(s) are light-emitting layers 35 that are coated by radiation thermal transfer from a donor 60 as described herein.

In step 320, selected in-situ tests are performed on OLED substrate 15 or donor 60, as described in reference to process flow 200 so as to measure one or more parameters associated with the organic layer (e.g. light-emitting layer 35). Such tests can include first in-situ test 270 and second in-situ test 280.

The selected in-situ tests are judiciously chosen from a set of either nondestructive or destructive in situ tests as appropriate, including but not limited to: nondestructive tests such as spectroscopic ellipsometry or diffraction of a laser beam off of a set of lines that form a grating, and destructive testing methods such as photoluminescence or laser desorption mass spectroscopy, Kelvin probe testing, atomic force microscopy, micro-Raman spectroscopy, X-ray fluorescence, or four point probe measurements. The measurements produce a signal 325 representative of potential defects produced in an OLED device manufactured from OLED substrate 15. Donor 60 can be tested, e.g. second in-situ test 280 to determine if sufficient organic material 70 was transferred. Testing donor 60 can be performed instead of or in addition to testing OLED substrate 15.

In step 330, data (e.g. signal 325) is acquired from the selected in-situ tests and analyzed. Analyses of selected in-situ tests can be performed via an appropriate software program or, alternately, can be analyzed by a process engineer or technician. The analysis of data that occurs in step 330 provides both a set of parametric data (e.g. parametric data 240, data 275, or data 285) that is stored for access by external process control, process monitoring, and lot binning functions (not shown) as well as information that is utilized for Step 340.

In decision step 340, the results of the data analyses performed in Step 330 are utilized to determine whether donor 60, OLED substrate 15, or any coatings thereon are of sufficient quality to continue through process flow 200. If yes, Method 300 proceeds to Step 360. If no, Method 200 proceeds to Step 350.

In step 350, donor 60, OLED substrate 15, or any coatings thereon have been determined to have defective portions and OLED substrate 15 is withdrawn from process flow 200 or marked or noted as being of inferior quality. Method 300 can thus end.

In step 360, the results of the data analyses performed in Step 330 are utilized to feed information downstream in process flow 200 and can be utilized to compensate for any undesirable but manageable process variations.

In step 370, a subsequent processing station is adjusted in response to the data signal to change the formation of the subsequent organic layer to compensate for undesirable but manageable potential defects identified in one processing station as a result of the data analysis performed in Step 330. For example, if it is determined that the thickness of the light-emitting layer 35 deposited atop OLED substrate 15 within radiation thermal transfer station 124 is 5 nanometers too thick, the subsequent deposition of the electron-transporting layer 40 in coating station 130 can be reduced by 5 nanometers such that the voltage necessary to drive the OLED display device remains consistent. This helps to increase yield and throughput of the radiation thermal transfer process via use of the data analysis in Step 330. Method 300 then ends.

Figure 7:
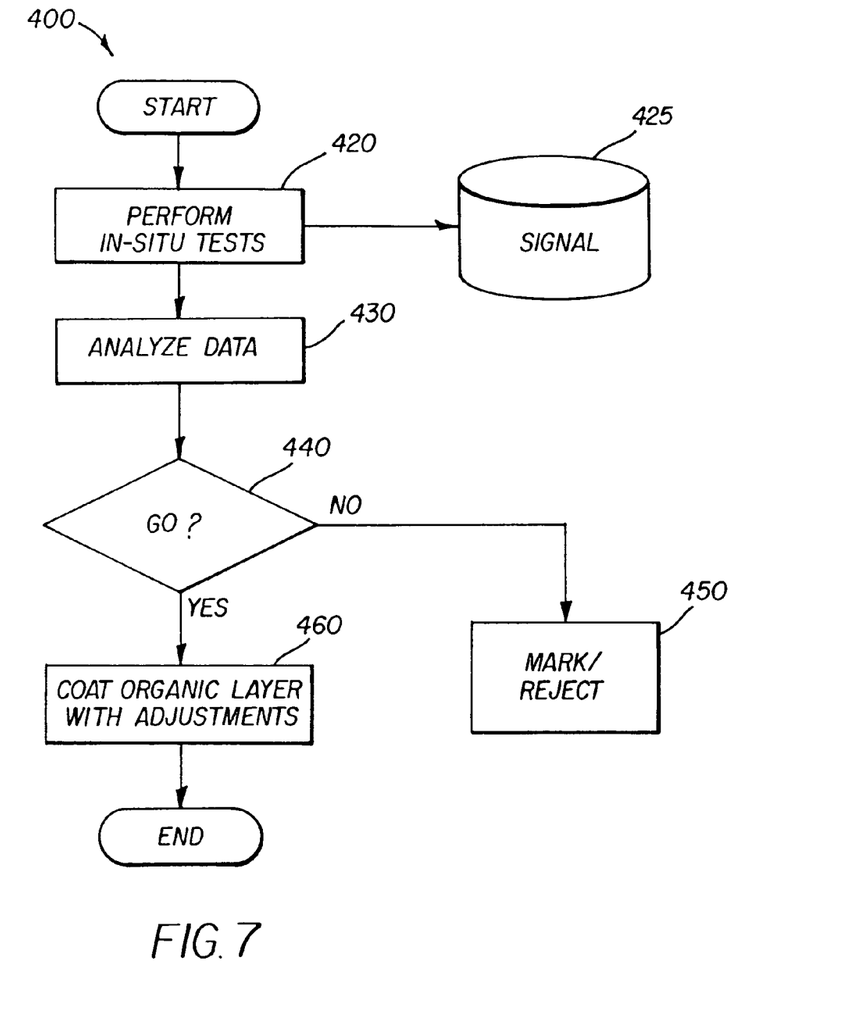
FIG. 7 is a block diagram of another embodiment of a method of making an OLED device in accordance with this invention.

Turning now to FIG. 7, there is shown a block diagram of another embodiment of a method 400 of making an OLED device in accordance with this invention that uses a donor to transfer organic material to a substrate. Method 400 includes the following steps:

In step 420, selected in situ tests are performed on donor 60 as described in reference to process flow 200 to determine if there is a defect and identify the location of such defect in donor 60. Such tests can include uncoated donor support tests 215 and coated donor tests 235.

The selected in situ tests are judiciously chosen from a set of either nondestructive or destructive in situ tests as appropriate, including but not limited to: nondestructive tests such as spectroscopic ellipsometry or diffraction of a laser beam off of a set of lines that form a grating, and destructive testing methods such as photoluminescence or laser desorption mass spectroscopy, Kelvin probe testing, atomic force microscopy, micro-Raman spectroscopy, X-ray fluorescence, or four point probe measurements. The measurements produce a signal 425 representative of potential defects in donor 60 to determine if sufficient organic material 70 will be transferred.

In step 430, data (e.g. signal 425) is acquired from the selected in situ tests and analyzed. Analyses of selected in situ tests can be performed via an appropriate software program or, alternately, can be analyzed by a process engineer or technician. The analysis of data that occurs in step 430 provides both a set of parametric data (e.g. parametric data 220 and parametric data 240) that is stored for access by external process control, process monitoring, and lot binning functions (not shown) as well as information that is utilized for Step 440.

In decision step 440, the results of the data analyses performed in Step 430 are utilized to determine whether donor 60 or any coatings thereon are of sufficient quality to continue through process flow 200. If yes, Method 400 proceeds to Step 460. If no, Method 400 proceeds to Step 450.

In step 450, donor 60 or any coatings thereon have been determined to have defective portions and donor 60 is withdrawn from process flow 200 or marked or noted as being of inferior quality. Method 400 thus ends.

Alternatively, donor 60 can be reworked in a further step (not shown) to correct for the substandard coating of organic material 70.

In step 460, an OLED substrate is processed by using radiation to transfer organic material 70 from donor 60 to OLED substrate 15. Step 460 can be adjusted to compensate for undesirable but manageable defective portions of donor 92 that are discovered as a result of the data analysis performed in Step 430. For example, if only portions of donor 60 are defective, organic material 70 can be transferred from acceptable portions of donor 60 to OLED substrate 15 to form an organic layer by excluding the identified defective portions of donor 60. This is particularly convenient when donor 60 is in the form of a continuous web.

The invention has been described in detail with particular reference to certain preferred embodiments thereof, but it will be understood that variations and modifications can be effected within the spirit and scope of the invention.

PARTS LIST

10 OLED device
15 substrate
20 anode
25 hole-injecting layer
30 hole-transporting layer
35 light-emitting layer
40 electron-transporting layer
50 cathode
60 donor
62 laser light beam
63 non-transfer surface
65 transfer surface
70 organic material
72 support
74 radiation-absorbing layer
80 thin-film transistor
82 raised surface portion
84 gap
86 receiving surface
90 heat
92 organic layer
100 controlled environment coater
110 unitary housing
112 controlled environment source
114 load lock
116 load lock
120 coating station

PARTS LIST (CON'T)

122 robot
124 radiation thermal transfer station
126 measurement station
128 robot
130 coating station
131 grasping means
134 coating apparatus
138 laser
140 measurement apparatus
146 transparent portion
148 coating apparatus
150 computer
152 data input/output
154 data input/output
156 data input/output
158 data input/output
200 process flow
215 uncoated donor support tests
220 parametric data
225 go/no-go mark
230 donor support deposition system
235 coated donor tests
240 parametric data
245 go/no-go mark
260 post-RTT OLED substrate
265 used donor support
270 in-situ test

PARTS LIST (CON'T)

275 data
280 in-situ test
285 data
290 post-RTT processing
300 method
310 block
320 block
325 signal
330 block
340 decision block
350 block
360 block
370 block
400 method
420 block
425 signal
430 block
440 decision block
450 block
460 block

What is claimed is:

1. A method of making an OLED device that corrects for potential defect(s) identified in one processing station by adjusting a subsequent processing station, comprising:
    a) processing an OLED substrate by adding at least one organic layer and measuring in-situ one or more parameters associated with such organic layer to produce a signal representative of potential defect(s) in a produced OLED device; and
    b) adjusting in a subsequent processing station in response to the signal to change the formation of a subsequent organic layer added to the OLED device to compensate for the potential defect(s).

2. The method of claim 1 wherein element a) includes using ellipsometry to determine the thickness of the organic layer and produce a signal representative of such thickness and wherein element b) adjusts the thickness of the subsequent organic layer.

3. The method of claim 1 wherein spectroscopic ellipsometry, diffraction of a laser beam, photoluminescence, laser desorption mass spectroscopy, Kelvin probe testing, atomic force microscopy, micro-Raman spectroscopy, X-ray fluorescence, or four point probe measurements are used to determine the thickness of the organic layer and produce a signal representative of such thickness and wherein element b) adjusts the thickness of the subsequent organic layer.

4. A method of making an OLED device that corrects for potential defect(s) identified in one processing station by adjusting a subsequent processing station, comprising:

a) using radiation to transfer organic material from a donor to an OLED substrate to form an organic layer and measuring in-situ one or more parameters associated with such organic layer to produce a signal representative of potential defect(s) in a produced OLED device; and b) adjusting a subsequent processing station in response to the signal to change the formation of a subsequent organic layer added to the OLED substrate to compensate for the potential defect(s).

5. In a method of making an OLED device that corrects for potential defect(s) identified in one processing station by adjusting a subsequent processing station or rejects the device, comprising:

a) using radiation to transfer organic material from a donor to an OLED substrate to form an organic layer and measuring in-situ one or more parameters associated with such organic layer to produce a signal representative of potential defect(s) in a produced OLED device; and b) adjusting a subsequent processing station in response to the signal to change the formation of a subsequent organic layer added to the OLED substrate to compensate for the potential defect(s) or rejecting the device.

6. The method of claim 5 wherein the rejected device is reworked to correct for identified defect(s).

7. A method of making an OLED device that corrects for potential defect(s) identified in one processing station by adjusting a subsequent processing station or rejecting or reworking the device, comprising:

a) using radiation to transfer organic material from a donor to an OLED substrate to form an organic layer; and b) testing in-situ the donor or the organic layer on the substrate or both to determine if sufficient organic material was or will be transferred and, if insufficient material was or will be transferred, rejecting or reworking the device to correct for the incomplete organic material transfer.

8. The method of claim 7 wherein the testing of the donor includes spectroscopic ellipsometry.

9. The method of claim 7 wherein the reworking the device includes radiation thermal transfer of an organic layer to the defective locations on the device using an additional donor.

10. The method of claim 7 wherein the testing of the substrate includes spectroscopic ellipsometry.

11. A method of making an OLED device that uses a donor to transfer organic material to a substrate, comprising:

a) testing in-situ the donor to determine if there is a defect and identifying the location of such defect in the donor; and b) using radiation to transfer organic material from acceptable portions of the donor to an OLED substrate by excluding the identified defective portions of the donor to form an organic layer.

12. The method of claim 11 further including:

c) testing in-situ the donor or the organic layer on the substrate or both to determine if sufficient organic material was or will be transferred and, if insufficient material was or will be transferred, rejecting or reworking the device to correct for the incomplete organic material transfer.

* * * * *